United States Patent
Jain et al.

(10) Patent No.: US 10,818,772 B2
(45) Date of Patent: Oct. 27, 2020

(54) HETEROJUNCTION BIPOLAR TRANSISTORS WITH AN INVERTED CRYSTALLINE BOUNDARY IN THE BASE LAYER

(71) Applicant: GLOBALFOUNDRIES Inc., Grand Cayman (KY)

(72) Inventors: Vibhor Jain, Essex Junction, VT (US); Pernell Dongmo, Essex Junction, VT (US); Cameron Luce, Colchester, VT (US); James W. Adkisson, Jericho, VT (US); Qizhi Liu, Lexington, MA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 17 days.

(21) Appl. No.: 15/961,364

(22) Filed: Apr. 24, 2018

(65) Prior Publication Data
US 2019/0326411 A1      Oct. 24, 2019

(51) Int. Cl.
| H01L 29/66 | (2006.01) |
| H01L 29/737 | (2006.01) |
| H01L 29/10 | (2006.01) |
| H01L 29/08 | (2006.01) |
| H01L 29/06 | (2006.01) |

(52) U.S. Cl.
CPC .... *H01L 29/66242* (2013.01); *H01L 29/0649* (2013.01); *H01L 29/0817* (2013.01); *H01L 29/1004* (2013.01); *H01L 29/7373* (2013.01)

(58) Field of Classification Search
None
See application file for complete search history.

(56) References Cited

U.S. PATENT DOCUMENTS

| 6,492,238 B1 | 12/2002 | Ahlgren et al. |
| 6,720,637 B2 | 4/2004 | Voldman |
| 6,927,476 B2 | 8/2005 | Freeman et al. |

(Continued)

OTHER PUBLICATIONS

Decoutere, et al., "Advanced Process Modules and Architectures for Half-Terahertz SiGe:C HBTs", 2009 IEEE Bipolar/BiCMOS Circuits and Technology Meeting, Capri, 2009, pp. 9-16.

(Continued)

*Primary Examiner* — Moazzam Hossain
*Assistant Examiner* — Stanetta D Isaac
(74) *Attorney, Agent, or Firm* — Thompson Hine LLP; Francois Pagette

(57) ABSTRACT

Fabrication methods and device structures for a heterojunction bipolar transistor. A trench isolation region is formed that surrounds an active region of semiconductor material, a collector is formed in the active region, and a base layer is deposited that includes a first section over the trench isolation region, a second section over the active region, and a third section over the active region that connects the first section and the second section. An emitter is arranged over the second section of the base layer, and an extrinsic base layer is arranged over the first section of the base layer and the third section of the base layer. The extrinsic base layer includes a first section containing polycrystalline semiconductor material and a second section containing single-crystal semiconductor material. The first and second sections of the extrinsic base layer intersect along an interface that extends over the trench isolation region.

11 Claims, 3 Drawing Sheets

(56) References Cited

U.S. PATENT DOCUMENTS

| | | |
|---|---|---|
| 6,965,133 B2 | 11/2005 | Geiss et al. |
| 7,064,416 B2 | 6/2006 | Dunn et al. |
| 7,462,923 B1 | 12/2008 | U'Ren |
| 7,709,338 B2 | 5/2010 | Liu et al. |
| 7,786,510 B2 | 8/2010 | Shim et al. |
| 7,883,954 B2 | 2/2011 | Magnee et al. |
| 9,368,608 B1* | 6/2016 | Camillo-Castillo ............... H01L 29/7371 |
| 2008/0116488 A1* | 5/2008 | Shim ............... H01L 29/1004 257/197 |
| 2014/0361350 A1* | 12/2014 | Chen ............... H01L 27/0623 257/273 |
| 2016/0380088 A1* | 12/2016 | Camillo-Castillo ............... H01L 29/7371 438/319 |

OTHER PUBLICATIONS

Rucker, et al., "Half-Terahertz SiGe BiCMOS Technology", 2012 IEEE 12th Topical Meeting on Silicon Monolithic Integrated Circuits in RF Systems, Santa Clara, CA, 2012, pp. 133-136.

Chevalier et al., "Towards THz SiGe HBTs", 2011 IEEE Bipolar/BiCMOS Circuits and Technology Meeting, Atlanta, GA, 2011, pp. 57-65.

Avenier, et al., "0.13 um SiGe BiCMOS Technology Fully Dedicated to mm-Wave Applications", IEEE Journal of Solid-State Circuits, vol. 44, No. 9, Sep. 2009.

Fox, et al., "SiGe:C HBT Architecture with Epitaxial External Base", 2011 IEEE Bipolar/BiCMOS Circuits and Technology Meeting, Atlanta, GA, 2011, pp. 70-73.

\* cited by examiner

HETEROJUNCTION BIPOLAR TRANSISTORS WITH AN INVERTED CRYSTALLINE BOUNDARY IN THE BASE LAYER

BACKGROUND

The invention relates generally to semiconductor device and integrated circuit fabrication and, in particular, to fabrication methods and device structures for a heterojunction bipolar transistor.

A bipolar junction transistor is a three-terminal electronic device that includes an emitter, an intrinsic base, and a collector in its construction. The intrinsic base is arranged between the emitter and collector in the structure of the device. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by a silicon-germanium (SiGe) alloy, which is characterized by a narrower band gap than silicon.

Improved fabrication methods and device structures for a heterojunction bipolar transistor are needed.

SUMMARY

In an embodiment of the invention, a structure is provided for a heterojunction bipolar transistor. The structure includes a trench isolation region surrounding an active region of semiconductor material, a collector in the active region, and a base layer including a first section over the trench isolation region, a second section over the active region, and a third section over the active region that connects the first and second sections. An emitter is arranged over the second section of the base layer, and an extrinsic base layer is arranged over the first section of the base layer and the third section of the base layer. The extrinsic base layer includes a first section containing polycrystalline semiconductor material and a second section containing single-crystal semiconductor material. The first section of the extrinsic base layer intersects the second section of the extrinsic base layer along an interface that extends over the trench isolation region.

In an embodiment of the invention, a method is provided for fabricating a heterojunction bipolar transistor. The method includes forming a trench isolation region surrounding an active region of semiconductor material that includes a collector, and epitaxially growing a base layer that includes a first section over the trench isolation region, a second section over the active region, and a third section over the active region that connects the first and second sections. The method further includes forming an emitter arranged over the second section of the base layer, and epitaxially growing an extrinsic base layer arranged over the first section of the base layer and the third section of the base layer. The extrinsic base layer includes a first section containing polycrystalline semiconductor material and a second section containing single-crystal semiconductor material. The first section of the extrinsic base layer intersects the second section of the extrinsic base layer along an interface that extends over the trench isolation region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
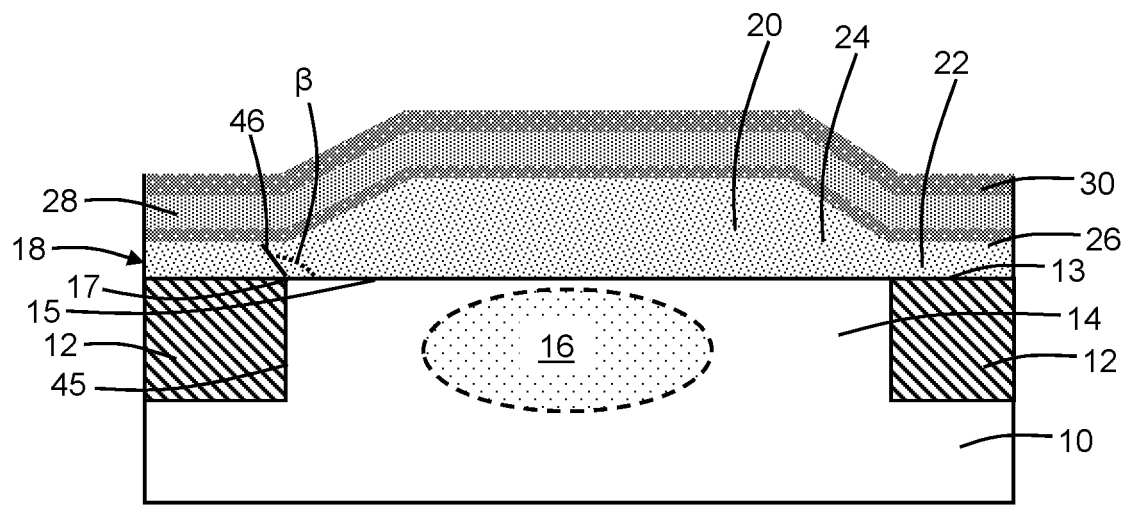
FIGS. 1-5 are cross-sectional views of a device structure at successive fabrication stages of a processing method in accordance with embodiments of the invention.

With reference to FIG. 1 and in accordance with embodiments of the invention, a substrate 10 is comprised of a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single-crystal silicon may be epitaxially grown on the substrate 10 and doped with an n-type dopant from Group V of the Periodic Table (e.g., phosphorus (P) or arsenic (As)) to produce n-type conductivity.

A trench isolation region 12 is formed in the substrate 10 and surrounds an active region 14 of the substrate 10 arranged interior of the trench isolation region 12. The trench isolation region 12 may be formed by a shallow trench isolation (STI) technique that relies on a lithography and dry etching process to define trenches in the substrate 10, deposits a dielectric material to fill the trenches, and planarizes the dielectric material using a chemical mechanical polishing (CMP) process to remove dielectric material from the field. The dielectric material may be comprised of an electrical insulator, such as an oxide of silicon (e.g., silicon dioxide ($SiO_2$)), deposited by chemical vapor deposition (CVD). A top surface 13 of the trench isolation region 12 and a top surface 15 of the active region 14 may be coplanar following planarization. The trench isolation region 12 includes a corner 17 that is defined at the intersection between its planarized top surface 13 and the vertical surface 45 bordering and contacting the active region 14.

A collector 16 is arranged in the active region 14 and may constitute all or a portion of the active region 14. The electrical conductivity of the collector 16 may be elevated relative to the substrate 10 by, for example, an ion implantation of an electrically-active dopant, such an n-type dopant, into a central portion of the active region 14. A subcollector (not shown) may extend laterally in the substrate 10 beneath the trench isolation region 12 in order to couple the collector 16 with one or more collector contact regions (not shown) arranged outside of the trench isolation region 12.

A base layer 18 is formed on the top surface 13 of the active region 14 and the top surface 15 of the trench isolation region 12. The base layer 18 may include a section 20, which may include single-crystal semiconductor material, that is positioned in vertical alignment with the active region 14 and that directly contacts the single-crystal semiconductor material of the active region 14. The base layer 18 may further include a section 22 that is arranged primarily over a top surface 13 of the trench isolation region 12. The section 22 of the base layer 18 may include polycrystalline semiconductor material, and the section 22 may be connected with the section 20 of the base layer 18 by a section 24 that also includes single-crystal semiconductor material. The section 20 of the base layer 18 is thicker than the section 22 of the base layer 18. The section 20 of the base layer 18 has a centrally uniform thickness, and the section 24 accommodates the thickness change to merge the sections 20, 22 of different thickness.

The base layer 18 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 18 may be uniform or may be graded and/or stepped across the thickness of base layer 18. If the germanium content is stepped, a partial thickness of the base layer 18, such as a partial thickness directly contacting the active region 14, may lack germanium and may instead be entirely comprised of silicon) to provide a thin intrinsic layer between the active region 14 and the base layer 18. The base layer 18 may be doped with a concentration of a dopant, such as a p-type dopant from Group III of the Periodic Table (e.g., boron (B) and/or indium (In)) that produces p-type conductivity.

The base layer 18 may be formed using an epitaxial growth process that is non-selective, such as ultra-high vacuum (UHV) chemical vapor deposition (CVD). Single-crystal semiconductor material (e.g., single-crystal silicon and/or single-crystal SiGe) epitaxially grows in the section 20, which is disposed on the active region 14. The crystal structure of the single-crystal semiconductor material of the active region 14 serves as a crystalline template for the growth of the crystal structure of the section 20 of the base layer 18. The facet angle between the surfaces of section 20 and section 24 is a consequence of the growth conditions to grow the base layer 18 and depends on the growth technique and conditions that are employed. Similarly, the growth rate of the section 22 is dependent on growth conditions. For typical UHV-CVD deposition conditions, the section 22 is considerably thinner than section 20 due to lower growth rate of semiconductor material over the trench isolation region 12 compared to the single-crystal growth rate over the active region 14.

The section 22 of the base layer 18 converges and intersects with the section 24 of the base layer 18 along an interface 46. The crystallographic boundary defined by the interface 46 occurs at the transition from single-crystal semiconductor material to polycrystalline semiconductor material. The interface 46 extends through the base layer 18 to the vicinity of the corner 17 of the trench isolation region 12. In an embodiment, the interface 46 may extend from an end point at the corner 17 of the trench isolation region 12 to an end point arranged over the top surface 13 of the trench isolation region 12. The interface 46 defines a single-crystal to polycrystalline boundary that is inclined at an angle, $\beta$, of greater than 90° relative to the top surface 15 of the active region 14. Because the angle is greater than 90°, the interface 46 extends above and overlies the top surface 13 of the trench isolation region 12. The interface 46 is inclined at an angle of less than 90° relative to the top surface 13 of the trench isolation region 12.

Dielectric layers 26, 28, 30 are located in a layer stack on a top surface of the base layer 18 and adopt the underlying topology of the base layer 18. The dielectric layers 26 and 30 may be comprised of a different dielectric material than the central dielectric layer 28. In an embodiment, the dielectric layers 26 and 30 may be comprised of silicon dioxide ($SiO_2$) and the dielectric layer 28 may be comprised of silicon nitride ($Si_3N_4$). The dielectric layers 26, 28, 30 may be serially formed as conformal layers by chemical vapor deposition (CVD), wet or dry thermal oxidation, or a combination of these processes, and are selected to etch selective to the semiconductor material constituting the base layer 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 2:
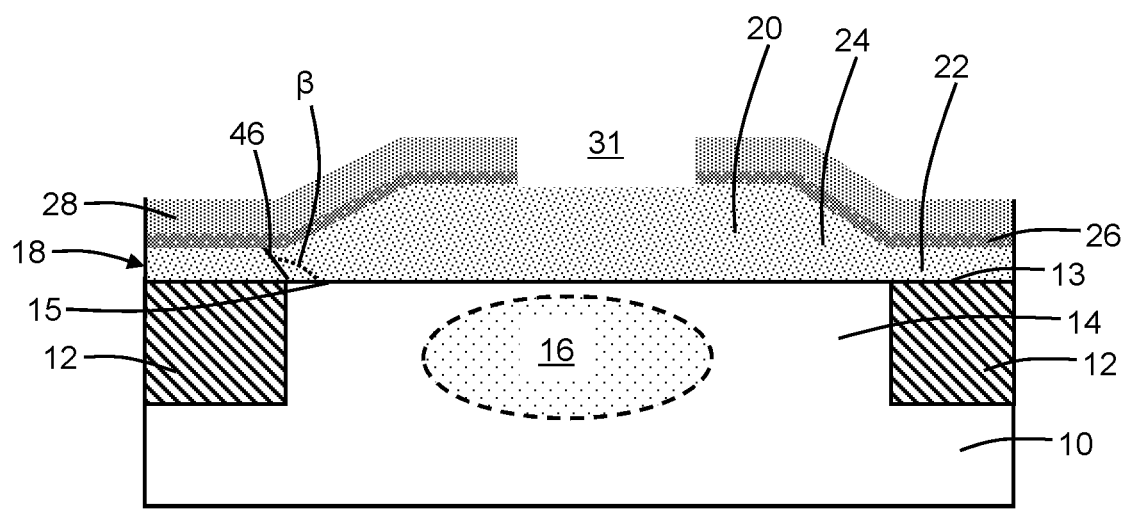

With reference to FIG. 2 in which like reference numerals refer to like features in FIG. 1 and at a subsequent fabrication stage of the processing method, the dielectric layers 26, 28, 30 are patterned using photolithography and etching processes to define an emitter window 31, which is aligned with the section 20 of the base layer 18 and which extends to the top surface of section 20. The etch mask used to pattern the emitter window 31 may be removed before the emitter window 31 is extended through the dielectric layer 26. As a result, the dielectric layer 30 may be removed when the emitter window 31 is extended through the dielectric layer 26.

Figure 3:
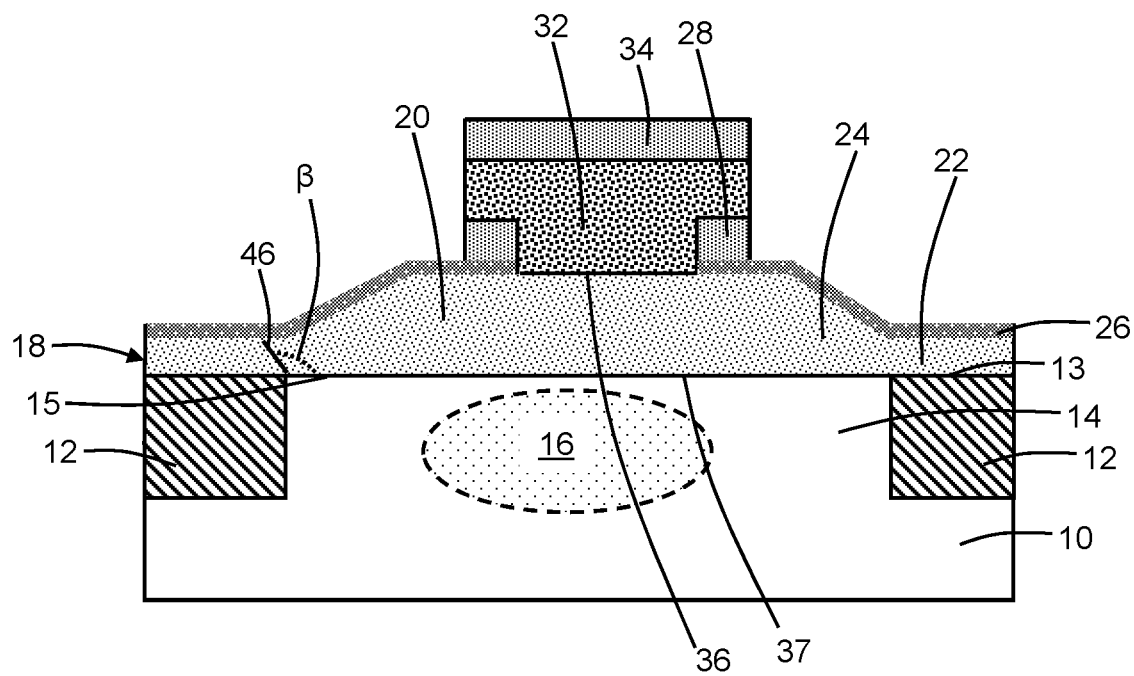

With reference to FIG. 3 in which like reference numerals refer to like features in FIG. 2 and at a subsequent fabrication stage of the processing method, an emitter 32 and an emitter cap 34 are formed by depositing a semiconductor layer that fills the emitter window 31 and covers the dielectric layer 28, depositing a cap layer on the semiconductor layer, forming an etch mask that masks these deposited layers over the emitter window 31, and etching with reactive ion etching (RIE) to pattern the emitter 32 and emitter cap 34. The emitter 32 is formed without self-alignment. As a result, the emitter window 31 and the subsequently-formed emitter 32 may be offset laterally from midplane above the section 20 of the base layer 18 due to lithography misalignments such that the emitter 32 is arranged close to one side or the other of the section 20 of the base layer 18.

The emitter 32 abuts the section 20 of the base layer 18 along a p-n junction 36, and the collector 16 abuts the section 20 of the base layer 18 along a p-n junction 37. The emitter 32 may be comprised of polycrystalline semiconductor material, such as polycrystalline silicon, deposited by chemical vapor deposition (CVD). In an embodiment, the semiconductor material constituting the emitter 32 may be doped with an n-type dopant from Group V of the Periodic Table (e.g., phosphorus (P) and/or arsenic (As)) to provide n-type conductivity. The emitter cap 34 may be comprised of a dielectric material, such as silicon nitride ($Si_3N_4$). The dielectric layer 28 may be removed from the field surrounding the emitter 32 when the emitter cap 34 is patterned.

Figure 4:
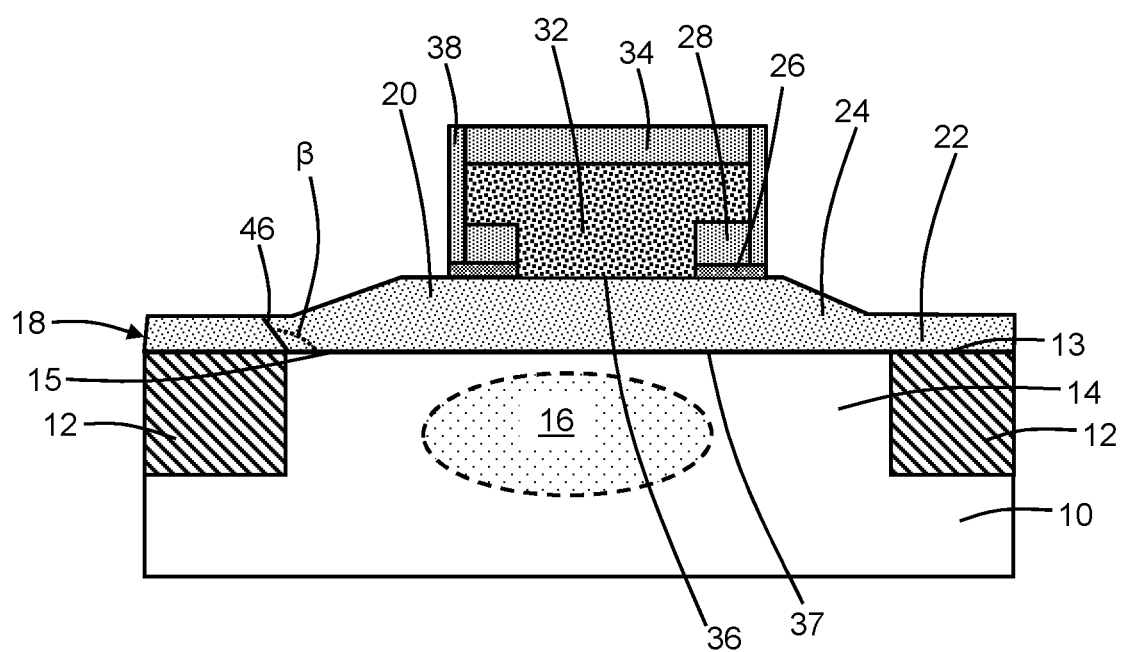

With reference to FIG. 4 in which like reference numerals refer to like features in FIG. 3 and at a subsequent fabrication stage of the processing method, a sidewall spacer 38 is formed that extends about the outer perimeter of the sidewalls of the emitter 32 and emitter cap 34. The sidewall spacer 38 may be comprised of a dielectric material, such as silicon nitride ($Si_3N_4$), deposited as a conformal layer by chemical vapor deposition (CVD) or atomic layer deposition (ALD) and etched with a directional etching process, such as reactive ion etching (ME). The dielectric layer 26 may be removed with a self-aligned etching process that removes the dielectric layer 26 selective to the base layer 18 and the emitter cap 34.

Figure 5:
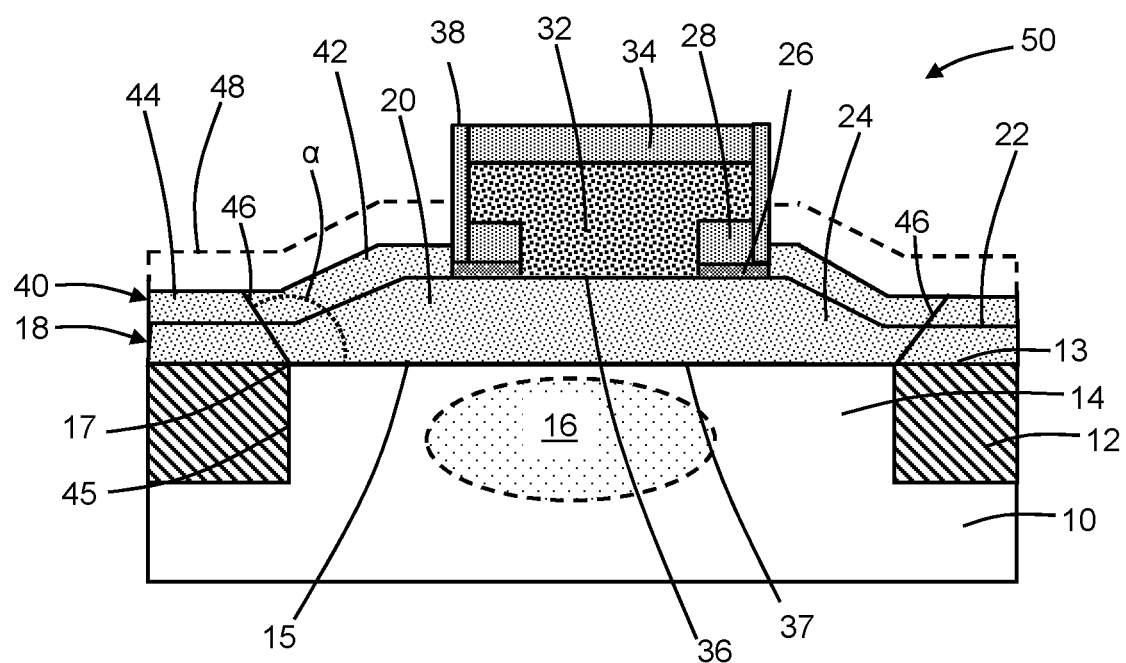

With reference to FIG. 5 in which like reference numerals refer to like features in FIG. 4 and at a subsequent fabrication stage of the processing method, an extrinsic base layer 40 is formed on the sections 22 and 24 of the base layer 18. In one embodiment, the extrinsic base layer 40 may be comprised of a semiconductor material (e.g., silicon or silicon-germanium) formed by a selective epitaxial growth (SEG) deposition process, such as reduced pressure chemical vapor deposition (CVD). If the extrinsic base layer 40 is comprised of silicon-germanium, the concentration of germanium may have a graded or an abrupt profile, and may include additional layers, such as a silicon cap. In a selective epitaxial growth process, nucleation of the constituent semiconductor material is suppressed on insulators, such as on the emitter cap 34 and sidewall spacer 38 covering the emitter 32. In an alternative embodiment, the sections 22 and 24 of the base layer 18 may be thinned by an etching process before the extrinsic base layer 40 is epitaxially grown from the base layer 18.

The extrinsic base layer 40 may be undoped or may be in situ doped during epitaxial growth with a concentration of a dopant, such as a dopant from Group III of the Periodic Table (e.g., boron (B) and/or indium (In)) and/or Group IV species (e.g., carbon (C), silicon (Si), and/or germanium (Ge)). In an embodiment, the extrinsic base layer 40 may be optionally implanted with ions delivering a p-type dopant under given implantation conditions (e.g., ion species, dose, kinetic energy, implantation angle). The implantation may deliver the ions to only a shallow depth into the extrinsic base layer 40 such that a lower portion adjacent to the base layer 18 retains the original doping concentration and the doping concentration is elevated in the implanted upper portion. The kinetic energy of the implanted ions may be adjusted to dope both extrinsic base layer 40 and base layer 18 for lower base resistance. Discounting dopant diffusion induced by the thermal budget, the dopant concentration in the extrinsic base layer 40 is greater than the dopant concentration in the base layer 18, which leads to the extrinsic base layer 40 having a lower electrical resistivity than the base layer 18 after dopant activation.

The extrinsic base layer 40 includes a section 42 that is formed on section 24 and a portion of section 20 of the base layer 18 and a section 44 that is formed on the section 22 of the base layer 18. The section 42 of the extrinsic base layer 40 converges and intersects with the section 44 of the extrinsic base layer 40 along an extension of the interface 46. The crystallographic boundary defined by the interface 46 occurs at the transition from single-crystal semiconductor material to polycrystalline semiconductor material in the base layer 18 and in the extrinsic base layer 40. The interface 46 extends through the extrinsic base layer 40 and the base layer 18 to the vicinity of the corner 17 of the trench isolation region 12. In an embodiment, the interface 46 may extend from an end point at the corner 17 of the trench isolation region 12 to an end point arranged over the top surface 13 of the trench isolation region 12. The combination of the growth conditions of the original base layer 18 and the growth conditions of the extrinsic base layer 40 will determine the final shape and angle of the interface 46 providing the crystallographic boundary.

After formation of the extrinsic base layer 40, the interface 46 defines a single-crystal to polycrystalline boundary that is inclined at an angle, a, of greater than 90° relative to the top surface 15 of the active region 14. Because the angle is greater than 90°, the interface 46 extends above and overlies the top surface 13 of the trench isolation region 12. The interface 46 is inclined at an angle less than 90° relative to the top surface 13 of the trench isolation region 12. In an embodiment, the inclination angle and shape of the interface 46 may be identical before and after the extrinsic base layer 40 is grown. In another embodiment, the inclination angle and shape of the interface 46 may be different before and after the extrinsic base layer 40 is grown.

A silicide layer 48 may be formed over the extrinsic base layer 40. The silicide layer 48 may be formed by a silicidation process that involves one or more annealing steps to form a silicide phase by reacting a layer of silicide-forming metal and the semiconductor material contacting the silicide-forming metal. The silicidation process may consume a portion of the extrinsic base layer 40 or an additional silicon layer (e.g., a silicon cap) may be deposited to supply the semiconductor material reacted to form the silicide layer 48. The extrinsic base layer 40 is arranged between the silicide layer 48 and the base layer 18.

During the various thermal processes of the process flow, the dopant contained in the extrinsic base layer 40 may be induced to diffuse from the base layer 18 and the extrinsic base layer 40 into the active region 14 and collector 16. The interface 46, which locates the single-crystal to poly-crystalline boundary over the trench isolation region 12, may operate to reduce this dopant diffusion. The reduction in dopant diffusion may lower the collector-base capacitance (Ccb) and may increase the collector-to-base breakdown voltage with emitter open circuited (BVcbo), which may improve the performance of the heterojunction bipolar transistor 50. The extrinsic base layer 40, which is raised relative to the base layer 18, may also reduce the base resistance (Rb) and break the trade-off in device design between collector-base capacitance and base resistance.

The device structure of the heterojunction bipolar transistor 50 has a vertical architecture that includes the collector 16, the emitter 32, and an intrinsic base provided by the section 20 of the base layer 18 located vertically between the emitter 32 and collector 16. The device structure of the heterojunction bipolar transistor 50 can be divided into an intrinsic region that includes the p-n junctions 36, 37, and an extrinsic region that is arranged outside of the intrinsic region. The extrinsic base layer 40 is formed on the base layer 18 in the extrinsic region, and the interface 46 is located in the extrinsic region.

Middle-of-line (MOL) processing and back-end-of-line (BEOL) processing follow, which includes formation of contacts, vias, and wiring for an interconnect structure coupled with the heterojunction bipolar transistor 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:
   a trench isolation region surrounding an active region of semiconductor material;
   a collector in the active region;
   a base layer including a first section over the trench isolation region, a second section over the active region, and a third section over the active region that connects the first section and the second section;
   an emitter arranged over the second section of the base layer; and
   an extrinsic base layer arranged over the first section of the base layer and the third section of the base layer, the extrinsic base layer including a first section containing polycrystalline semiconductor material and a second section containing single-crystal semiconductor material, and the first section of the extrinsic base layer intersecting the second section of the extrinsic base layer along an interface that extends over the trench isolation region.

2. The structure of claim 1 wherein the active region includes a top surface, and the interface is inclined at an angle of greater than 90° relative to the top surface of the active region.

3. The structure of claim 2 wherein the trench isolation region includes a top surface that is coplanar with the top surface of the active region, and the interface is inclined at an angle of less than 90° relative to the top surface of the trench isolation region.

4. The structure of claim 2 wherein the interface extends into the base layer and is arranged between the first section of the base layer and the third section of the base layer, the first section of the base layer contains polycrystalline semiconductor material, and the third section of the base layer contains single-crystal semiconductor material.

5. The structure of claim 4 wherein the trench isolation region includes a surface adjacent to the active region that intersects the top surface of the trench isolation region at a corner, and the interface has a first end point arranged over the top surface of the trench isolation region and a second end point arranged at the corner.

6. The structure of claim 1 wherein the trench isolation region includes a top surface that is coplanar with the top surface of the active region, and the interface is inclined at an angle of less than 90° relative to the top surface of the trench isolation region.

7. The structure of claim 1 wherein the interface extends into the base layer and is arranged between the first section of the base layer and the third section of the base layer, and the first section of the base layer contains polycrystalline semiconductor material and the third section of the base layer contains single-crystal semiconductor material.

8. The structure of claim 7 wherein the trench isolation region includes a top surface and a surface adjacent to the active region that intersects the top surface at a corner, and the interface has a first end point arranged over the trench isolation region and a second end point arranged at the corner.

9. The structure of claim 1 further comprising:
   a silicide layer over the extrinsic base layer,
   wherein the first section of the extrinsic base layer is arranged between the silicide layer and the base layer.

10. The structure of claim 9 wherein the interface is arranged between the silicide layer and the base layer.

11. The structure of claim 1 further comprising:
    a sidewall spacer surrounding the emitter.

* * * * *